(12) United States Patent
Chen et al.

(10) Patent No.: US 10,679,953 B2
(45) Date of Patent: Jun. 9, 2020

(54) INTEGRATED FAN-OUT STRUCTURE AND METHOD OF FORMING

(71) Applicant: Taiwan Semiconductor Manufacturing Company, Ltd., Hsinchu (TW)

(72) Inventors: Hsien-Wei Chen, Hsinchu (TW); An-Jhih Su, Taoyuan (TW); Tsung-Shu Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/524,514

(22) Filed: Jul. 29, 2019

(65) Prior Publication Data

US 2019/0348381 A1 Nov. 14, 2019

Related U.S. Application Data

(62) Division of application No. 15/724,475, filed on Oct. 4, 2017, now Pat. No. 10,366,959, which is a division
(Continued)

(51) Int. Cl.
*H01L 21/00* (2006.01)
*H01L 23/00* (2006.01)
(Continued)

(52) U.S. Cl.
CPC ............ *H01L 24/02* (2013.01); *H01L 21/565* (2013.01); *H01L 23/3114* (2013.01); *H01L 23/49811* (2013.01); *H01L 23/5389* (2013.01); *H01L 24/19* (2013.01); *H01L 24/20* (2013.01); *H01L 21/568* (2013.01); *H01L 25/0657* (2013.01); *H01L 25/105* (2013.01); *H01L 2224/02315* (2013.01); *H01L 2224/02371* (2013.01); *H01L 2224/02373* (2013.01); *H01L 2224/02379* (2013.01); *H01L 2224/04105* (2013.01); *H01L 2224/12105* (2013.01); *H01L 2224/24137* (2013.01); *H01L 2224/32145* (2013.01); *H01L 2224/32225* (2013.01); *H01L 2224/48227* (2013.01); *H01L 2224/73265* (2013.01); *H01L 2224/73267* (2013.01);
(Continued)

(58) Field of Classification Search
CPC . H01L 24/02; H01L 23/49811; H01L 23/5389
See application file for complete search history.

(56) References Cited

U.S. PATENT DOCUMENTS 8,361,842 B2 1/2013 Yu et al.
8,680,647 B2 3/2014 Yu et al.
(Continued)

*Primary Examiner* — Laura M Menz
(74) *Attorney, Agent, or Firm* — Slater Matsil, LLP

(57) ABSTRACT

Semiconductor devices and methods of forming are provided. A molding compound extends along sidewalls of a first die and a second die. A redistribution layer is formed over the first die, the second die, and the molding compound. The redistribution layer includes a conductor overlying a gap between the first die and the second die. The conductor is routed at a first angle over an edge of the first die. The first angle is measured with respect to a straight line that extends along a shortest between the first die and the second die, and the first angle is greater than 0.

20 Claims, 21 Drawing Sheets

US 10,679,953 B2
Page 2

Related U.S. Application Data of application No. 14/942,627, filed on Nov. 16, 2015, now Pat. No. 9,786,614.

(51) Int. Cl.
  *H01L 23/498* (2006.01)
  *H01L 23/538* (2006.01)
  *H01L 21/56* (2006.01)
  *H01L 23/31* (2006.01)
  H01L 25/065 (2006.01)
  H01L 25/10 (2006.01)

(52) U.S. Cl.
  CPC .............. *H01L 2224/92244* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,000,584 B2 | 4/2015 | Lin et al. | |
| 9,048,222 B2 * | 6/2015 | Hung ................. | H01L 21/563 |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2009/0085186 A1 * | 4/2009 | Meyer ................. | H01L 21/561 |
| | | | 257/690 |
| 2013/0026468 A1 | 1/2013 | Yoshimuta et al. | |
| 2013/0062761 A1 | 3/2013 | Lin et al. | |
| 2013/0307140 A1 | 11/2013 | Huang et al. | |
| 2014/0203429 A1 | 7/2014 | Yu et al. | |
| 2014/0252646 A1 * | 9/2014 | Hung ................. | H01L 23/5386 |
| | | | 257/774 |
| 2014/0264590 A1 | 9/2014 | Yu et al. | |
| 2014/0264930 A1 * | 9/2014 | Yu ........................ | H01L 24/19 |
| | | | 257/774 |
| 2015/0076713 A1 * | 3/2015 | Tsai ..................... | H01L 24/96 |
| | | | 257/782 |
| 2017/0110427 A1 * | 4/2017 | Su ....................... | H01L 23/49827 |

* cited by examiner

INTEGRATED FAN-OUT STRUCTURE AND METHOD OF FORMING

PRIORITY CLAIM AND CROSS-REFERENCE

This is a divisional of U.S. patent application Ser. No. 15/724,475, filed on Oct. 4, 2017, entitled "Integrated Fan-Out Structure and Method of Forming," which is a divisional of U.S. patent application Ser. No. 14/942,627, filed on Nov. 16, 2015, now U.S. Pat. No. 9,786,614, issued Oct. 10, 2017, and entitled "Integrated Fan-Out Structure and Method of Forming," which applications are incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
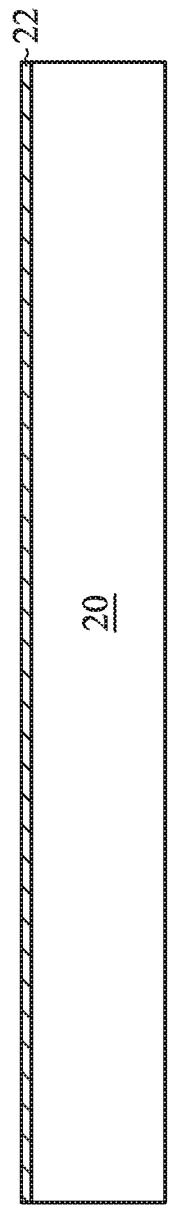
FIGS. 1 through 16 are cross-sectional views of intermediate stages in the manufacturing of a Through Via (TV) package in accordance with some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out ("InFO") package including and methods of forming the same are provided in accordance with various exemplary embodiments. The intermediate stages of forming the InFO package are illustrated and variations of embodiments are discussed.

FIGS. 1-16 illustrate cross-sectional views of intermediate steps in forming a semiconductor package in accordance with some embodiments. Referring first to FIG. 1, there is shown a carrier substrate 20 having a release layer 22 formed thereon. Generally, the carrier substrate 20 provides temporary mechanical and structural support during subsequent processing steps. The carrier substrate 20 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 20 is planar in order to accommodate further processing.

The release layer 22 is an optional layer formed over the carrier substrate 20 that may allow easier removal of the carrier substrate 20. As explained in greater detail below, various layers and devices will be placed over the carrier substrate 20, after which the carrier substrate 20 may be removed. The optional release layer 22 aids in the removal of the carrier substrate 20, reducing damage to the structures formed over the carrier substrate 20. The release layer 22 may be formed of a polymer-based material. In some embodiments, the release layer 22 is an epoxy-based thermal release material, which loses its adhesive property when heated, such as a Light-to-Heat-Conversion (LTHC) release coating. In other embodiments, the release layer 22 may be an ultra-violet (UV) glue, which loses its adhesive property when exposed to UV light. The release layer 22 may be dispensed as a liquid and cured. In other embodiments, the release layer 22 may be a laminate film laminated onto the carrier substrate 20. Other release layers may be utilized.

Figure 2:
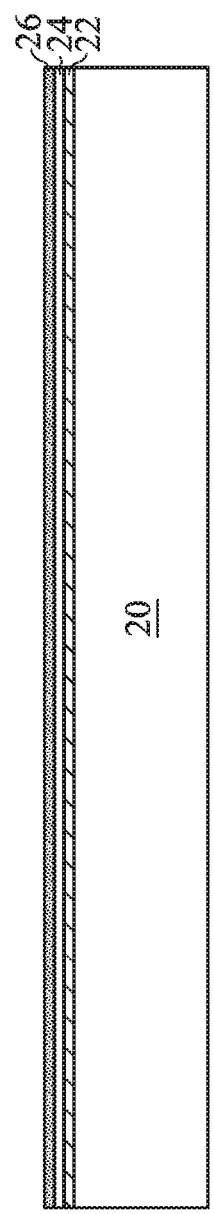

Referring to FIG. 2, buffer layer 24 is formed over release layer 22. Buffer layer 24 is a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, buffer layer 24 is a planar layer having a uniform thickness, wherein the thickness may be between about 2 µm and about 6 µm. The top and the bottom surfaces of buffer layer 24 are also planar.

Referring now to FIGS. 2 to 6, there is shown formation of through vias ("TVs") 33 (see FIG. 6) in accordance with some embodiments. The through vias 33 provide an electrical connection from one side of the package to another side of the package. For example, as will be explained in greater detail below, one or more dies will be mounted to the buffer layer 24 and a molding compound will be formed around the through vias and the die. Subsequently, another device, such as another die, package, substrate, or the like, may be attached to the die and the molding compound. The through vias 33 provide an electrical connection between the another device and the backside of the package without having to pass electrical signals through the die mounted to the buffer layer 24.

The through vias 33 may be formed, for example, by forming a conductive seed layer 26 over the buffer layer 24, as shown in FIG. 2. In some embodiments, seed layer 26 is a metal layer, which may be a single layer or a composite layer comprising a plurality of sub-layers formed of different materials. Seed layer 26 may be made of copper, titanium, nickel, gold, or a combination thereof, or the like. In some embodiments, seed layer 26 comprises a titanium layer and a copper layer over the titanium layer. Seed layer 26 may be formed using, for example, physical vapor deposition (PVD), CVD, atomic layer deposition (ALD), a combination thereof, or the like. In some embodiments, seed layer 26 comprises titanium layer 26A and copper layer 26B over titanium layer 26A. In alternative embodiments, seed layer 26 is a copper layer.

Figure 3:
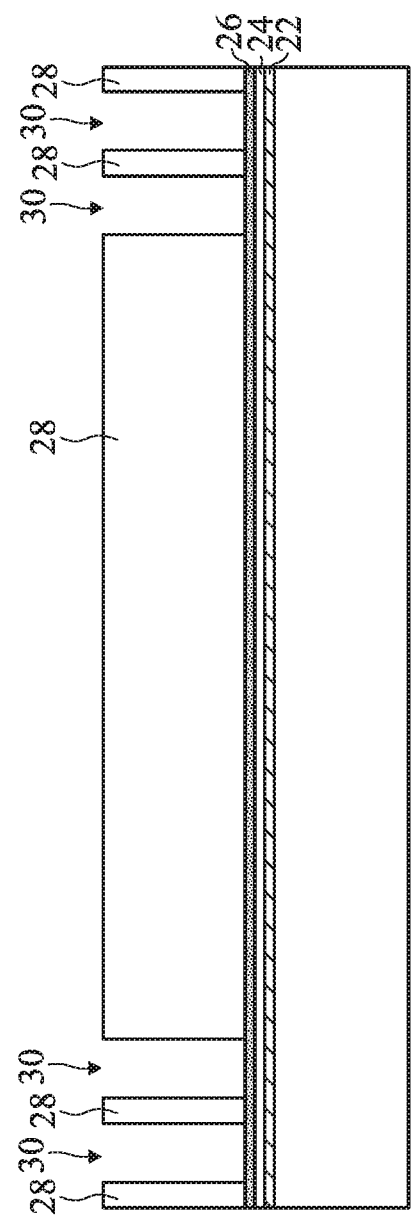
Figure 4:
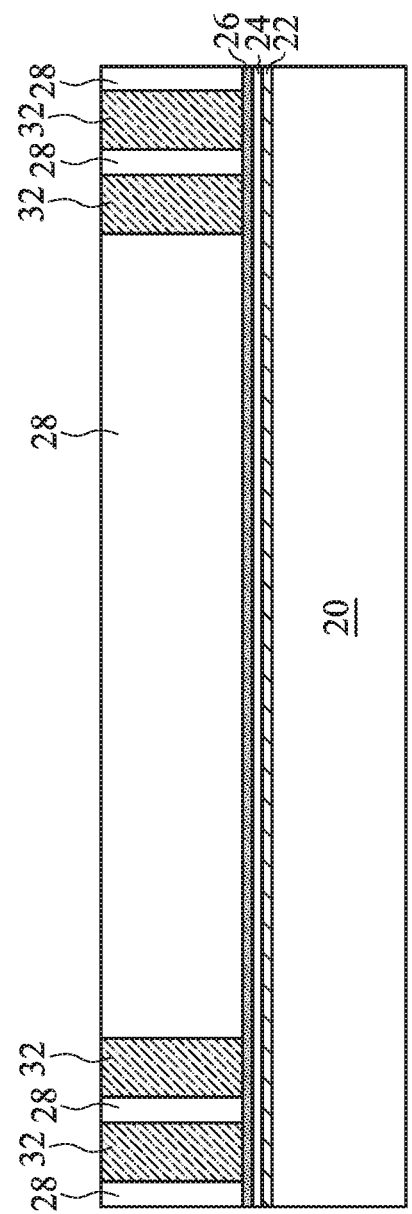

Turning to FIG. 3, a mask layer, such as patterned photoresist layer 28, may be deposited and patterned, wherein openings 30 in the mask layer expose the seed layer 26. Referring to FIG. 4, openings 30 (see FIG. 2) may be filled with a conductive material using, for example, an electroless plating process or an electrochemical plating process, thereby creating metal features 32. The plating process may uni-directionally fill openings (e.g., from seed layer 26 upwards) in the patterned photoresist layer 28. Uni-directional filling may allow for more uniform filling of such openings. Alternatively, another seed layer may be formed on sidewalls of openings 30 in the patterned photoresist layer 28, and such openings may be filled multi-directionally. Metal features 32 may comprise copper, aluminum, tungsten, nickel, solder, or alloys thereof. The top-view shapes of metal features 32 may be rectangles, squares, circles, or the like. The heights of metal features 32 are determined by the thickness of the subsequently placed dies 34 (shown in FIG. 7), with the heights of metal features 32 greater than the thickness of dies 34 in some embodiments.

Figure 5:
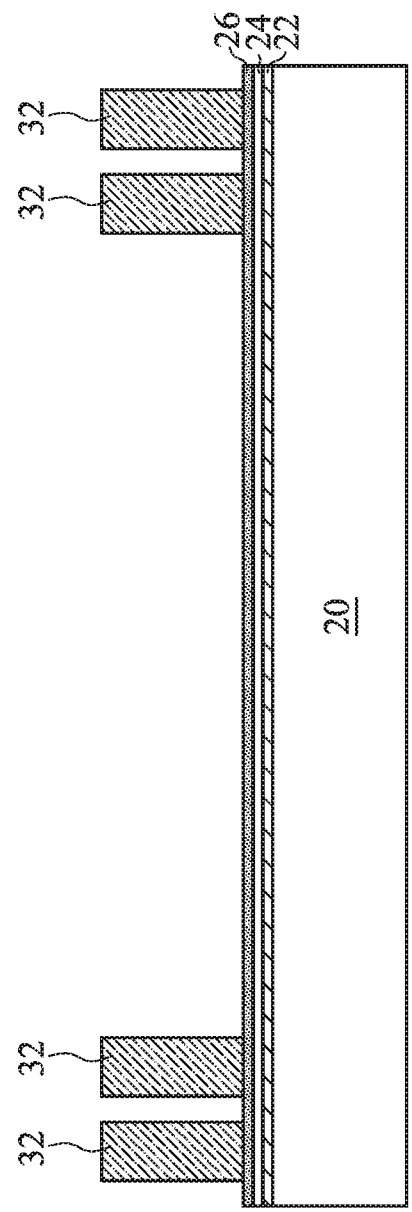
Figure 6:
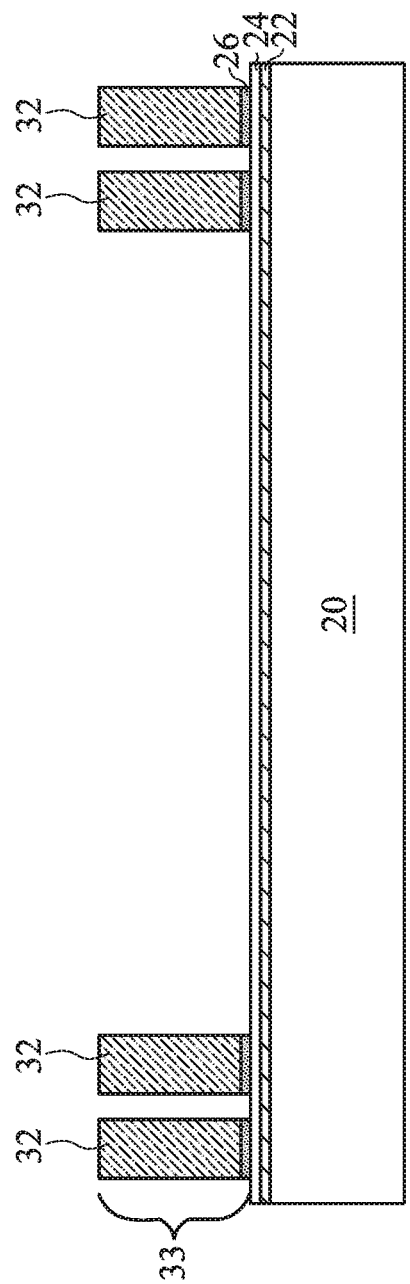

Next, the mask layer may be removed, for example in an ashing and/or wet strip process, as shown in FIG. 5. Referring to FIG. 6, an etch step is performed to remove the exposed portions of seed layer 26, wherein the etching may be an anisotropic etching. The portions of seed layer 26 that are overlapped by metal features 32, on the other hand, remain not etched. Metal features 32 and the remaining underlying portions of seed layer 26 form through vias 33.

Although seed layer 26 is shown as a layer separate from metal features 32, when seed layer 26 is formed of a material similar to or the same as the respective overlying metal features 32, seed layer 26 may be merged with metal features 32 with no distinguishable interface between. In some embodiments, there exist distinguishable interfaces between seed layer 26 and the overlying metal features 32. The through vias 33 can also be realized with metal wire studs placed by a wire bonding process, such as a copper wire bonding process. The use of a wire bonding process may eliminate the need for depositing seed layer 26, depositing and patterning mask layer 28, and plating to form the through vias 33.

Figure 7:
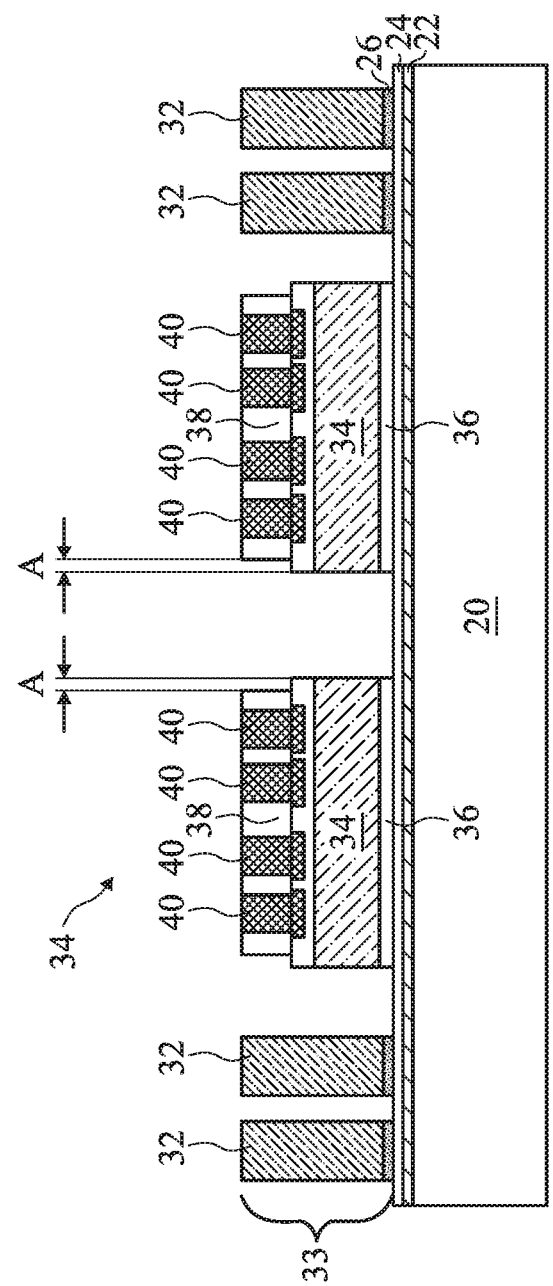

FIG. 7 illustrates attaching an integrated circuit die 34 to the backside of buffer layer 24 in accordance with some embodiments. In some embodiments, the integrated circuit die 34 may be adhered to buffer layer 24 by an adhesive layer 36, such as a die-attach film (DAF). A thickness of the adhesive layer 36 may be in a range from about 5 µm to about 50 µm, such as about 10 um. The integrated circuit die 34 may be two dies as illustrated in FIG. 7, or in some embodiments, one, or more than two dies, may be attached, and may include any die suitable for a particular approach. For example, the integrated circuit dies 34 may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. The integrated circuit dies 34 may be attached to any suitable location for a particular design or application.

Before being attached to the buffer layer 24, each integrated circuit die 34 may be processed according to applicable manufacturing processes to form integrated circuits (not shown) in the integrated circuit die 34. In some exemplary embodiments, the integrated circuit dies 34 include metal pillars 40 (such as copper posts) that are electrically coupled to devices such as transistors (not shown) in dies 34. In some embodiments, dielectric layer 38 is formed at the top surface of the respective die 34, with metal pillars 40 disposed in dielectric layer 38. The top surfaces of metal pillars 40 may be level with the top surfaces of dielectric layer 38 in some embodiments. In some embodiments, before integrated circuit dies 34 are attached to buffer layer 24, dielectric layer 38 may be patterned so that an edge of the dielectric layer 38 is offset a distance A from a lower edge of the integrated circuit die 34, where distance A is measured in a plan view, as shown in FIG. 7. In some embodiments, distance A is about 5 µm to about 100 µm, such as about 30 µm. As will be explained in greater detail below, in some embodiments this offset may enable die-to-die metal connections with greater reliability during thermal cycling. Any suitable method of forming the offset may be used. In some embodiments, dielectric layer 38 is photosensitive, and the offset may be formed by exposing and developing. In some embodiments, the offset may be formed using an etching process.

Figure 8:
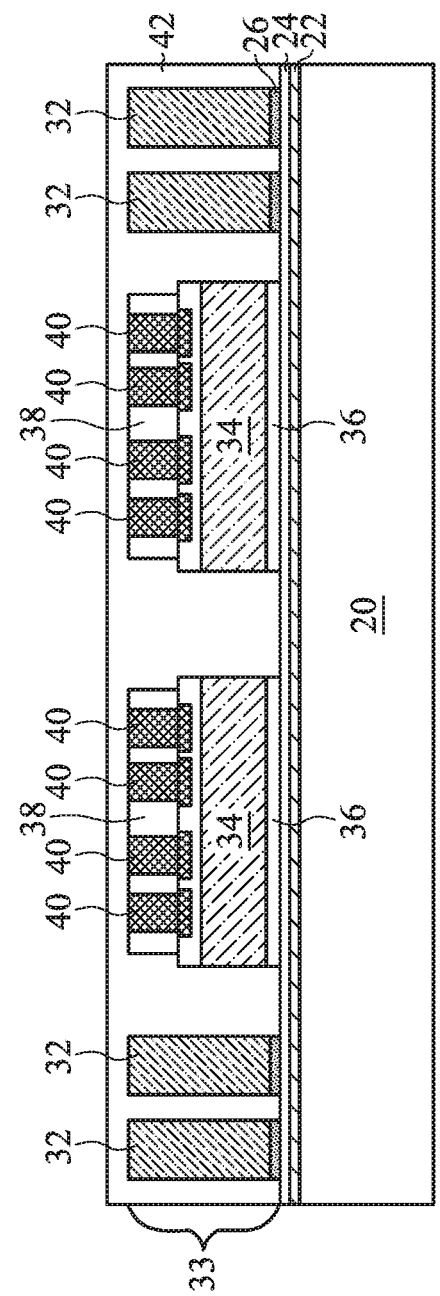

Referring to FIG. 8, molding material 42 is molded on dies 34 and TVs 33. Molding material 42 fills the gaps between dies 34 and TVs 33, and may be in contact with buffer layer 24. Furthermore, molding material 42 is filled into the gaps between metal pillars 40 when metal pillars 40 are protruding metal pillars. Molding material 42 may include a molding compound, a molding underfill, an epoxy, or a resin. The top surface of molding material 42 is higher than the top ends of metal pillars 40 and TVs 33.

Figure 9:
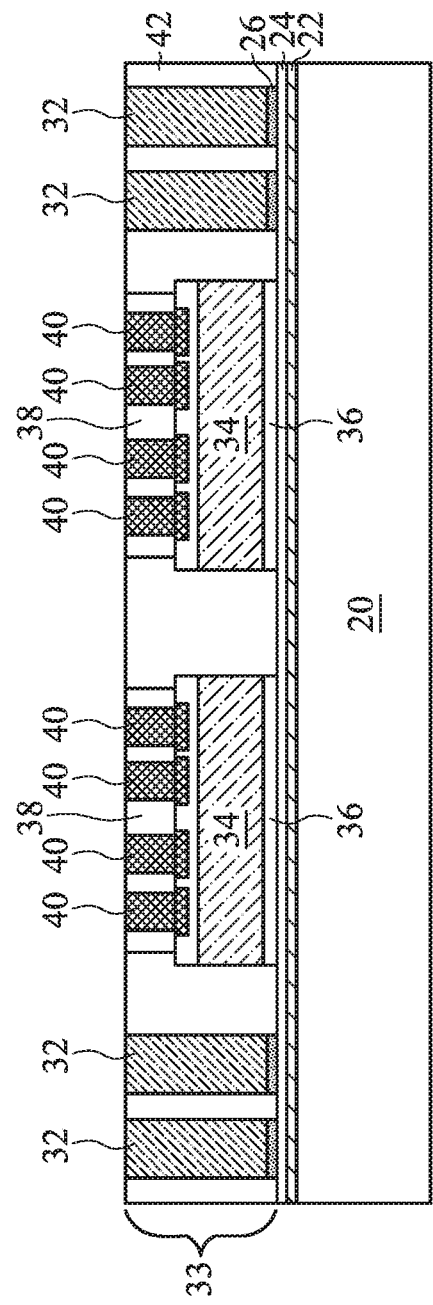

Next, a grinding step is performed to thin molding material 42, until metal pillars 40 and TVs 33 are exposed. The resulting structure is shown in FIG. 9. Due to the grinding, the top ends of metal features 32 are substantially level (coplanar) with the top ends of metal pillars 40, and are substantially level (coplanar) with the top surface of molding material 42. As a result of the grinding, metal residues such as metal particles may be generated, and left on the top surfaces. Accordingly, after the grinding, a cleaning may be performed, for example, through a wet etching, so that the metal residue is removed.

Next, referring to FIGS. 10-16, one or more redistribution layers (RDLs) are formed. Generally, RDLs provide a conductive pattern that allows a pin-out contact pattern for a completed package different than the pattern of through vias 33 and/or metal pillars 40, allowing for greater flexibility in the placement of through vias 33 and dies 34. The RDLs may be utilized to provide an external electrical connection to dies 34 and/or to through vias 33. The RDLs may further be used to electrically couple dies 34 to through vias 33, which may be electrically coupled to one or more other packages, package substrates, components, the like, or a combination thereof. The RDLs comprise conductive lines and via connections, wherein via connections connect an overlying line to an underlying conductive feature.

Figure 10:
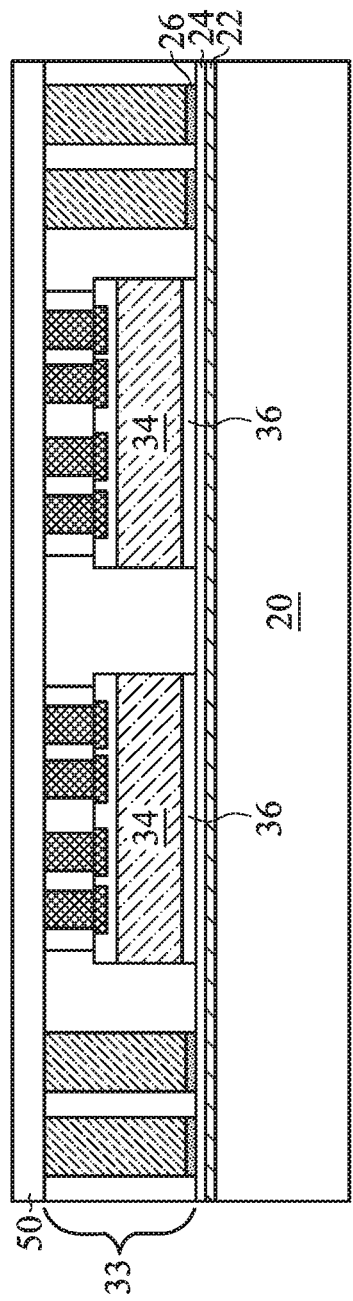

The RDLs may be formed using any suitable process. For example, as shown in FIG. 10, in some embodiments, dielectric layer 50 is formed on the molding material 42 and integrated circuit die 34. In some embodiments, dielectric layer 50 is formed of a polymer, which may be a photo-sensitive material such as polybenzoxazole (PBO), polyimide, benzocyclobutene (BCB), or the like, that may be patterned using lithography. In other embodiments, dielectric layer 50 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 50 may be formed by spin coating, lamination, CVD, the like, or a combination thereof.

Figure 11:
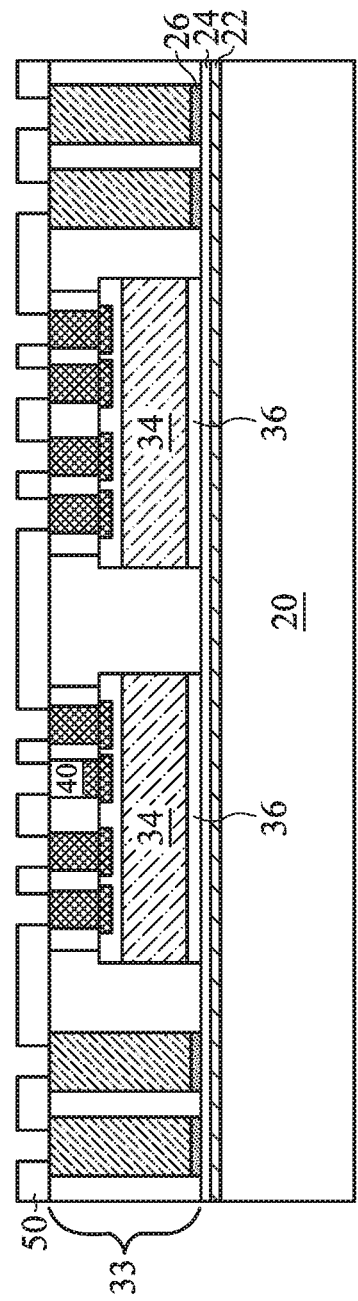

Referring to FIG. 11, dielectric layer 50 is then patterned to form openings to expose metal pillars 40 and the through vias 33. In embodiments in which dielectric layer 50 is formed of a photo-sensitive material, the patterning may be performed by exposing dielectric layer 50 in accordance with a desired pattern and developed to remove the unwanted material, thereby exposing metal pillars 40 and the through vias 33. Other methods, such as using a patterned mask and etching, may also be used to pattern dielectric layer 50.

Figure 12:
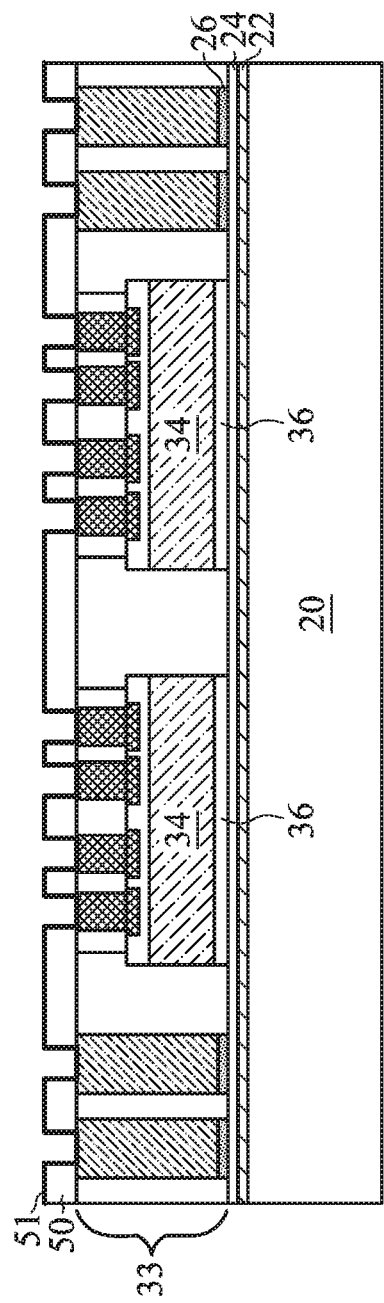

Referring to FIG. 12, a seed layer 51 is formed over dielectric layer 50 and in the openings formed in dielectric layer 50. In some embodiments, seed layer 51 is a metal layer, which may be a single layer or a composite layer comprising a plurality of sub-layers formed of different materials. In some embodiments, seed layer 51 comprises a titanium layer and a copper layer over the titanium layer. Seed layer 51 may be formed using, for example, PVD, or the like.

Figure 13:
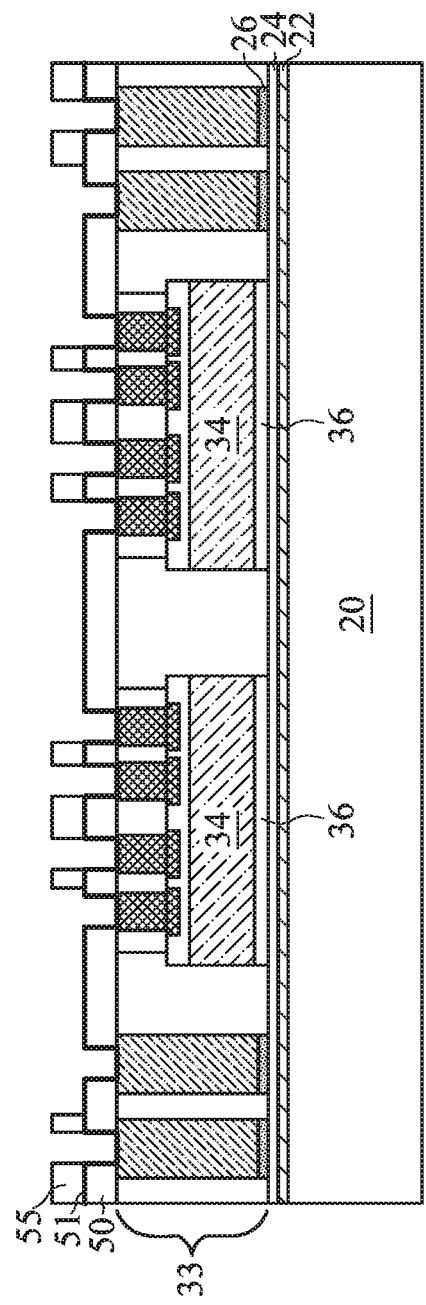

Referring to FIG. 13, a mask 55 is then formed and patterned on seed layer 51 in accordance with a desired redistribution pattern, such as the pattern illustrated in FIG. 13. In some embodiments, the mask 55 is a photoresist formed by spin coating or the like and exposed to light for patterning. The patterning forms openings through the mask 55 to expose seed layer 51.

Figure 14:
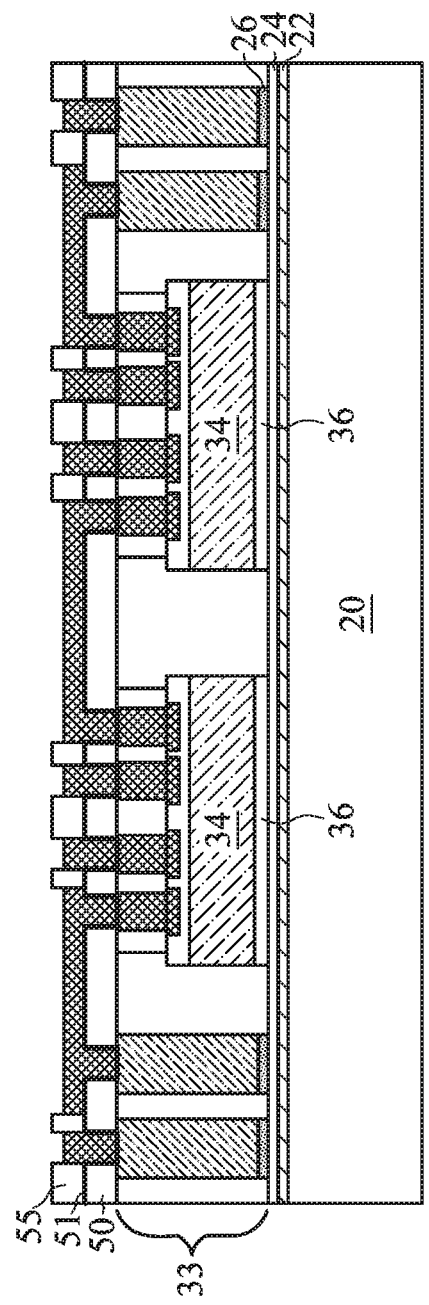
Figure 15:
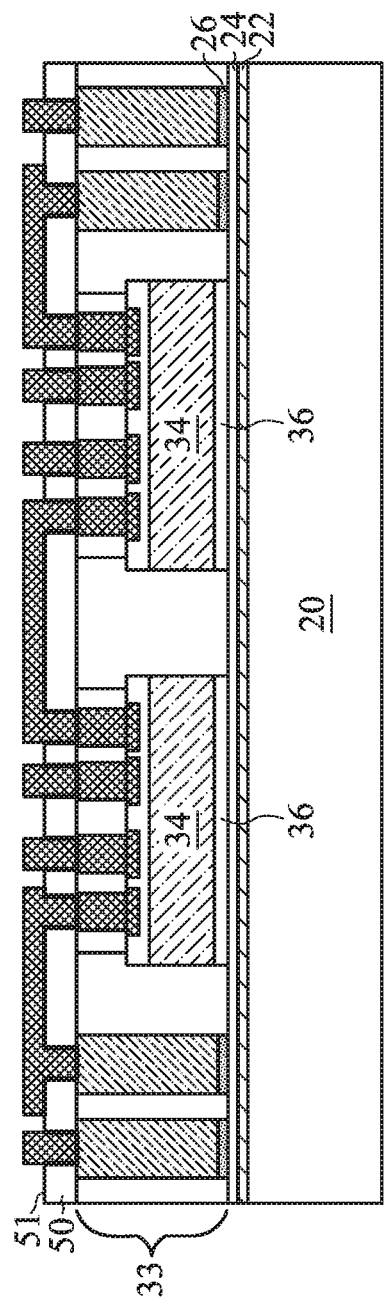

Next, referring to FIG. 14, a conductive material is formed in the openings of the mask and on the exposed portions of seed layer 51. The conductive material may be formed by plating, such as electroplating or electroless plating, or the like. The conductive material may comprise a metal, like copper, titanium, tungsten, aluminum, or the like. Then, referring to FIG. 15, the mask and portions of seed layer 51 on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 16:
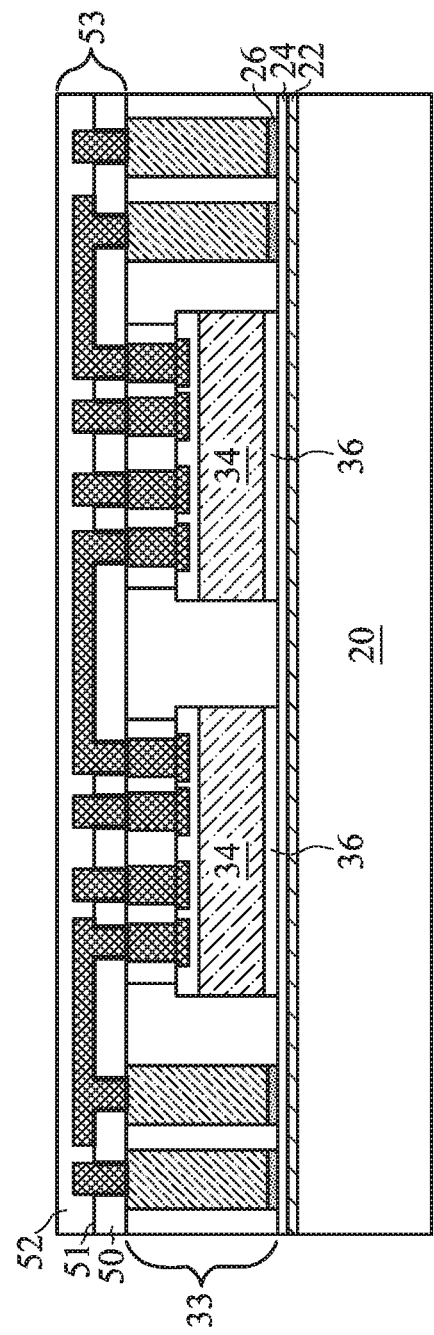

Referring to FIG. 16, dielectric layer 52 is formed over dielectric layer 50 to provide a more planar surface for subsequent layers and may be formed using similar materials and processes as used to form dielectric layer 50. In some embodiments, dielectric layer 52 is formed of polymer, a nitride, an oxide, or the like. In some embodiments, dielectric layer 52 is PBO formed by a spin-on process. Together, dielectric layers 50 and 52, and the conductive lines and via connections disposed within these layers, form one redistribution layer 53.

In some embodiments, there may exist coefficient of thermal expansion (CTE) mismatch between the material typically used for the integrated circuit dies 34 and the material used for RDL 53 dielectric layers, such as dielectric layers 50 and 52. The CTE mismatch between these materials may lead to reduced reliability of die-to-die metal connections, particularly during thermal cycling. For example, the different rates of expansion and contraction during changing temperatures between the integrated circuit dies 34 and the metal connections within RDL 53, caused by the CTE mismatch, creates stress on the metal connections within RDL 53. The stress is particularly an issue for metal connections overlying a gap between two integrated circuit dies 34. In some embodiments, increasing the length of the metal connections of RDL 53 between the integrated circuit dies 34 may help to reduce stress on the metal connections and to increase reliability of the package, particularly during thermal cycling.

Figure 17:
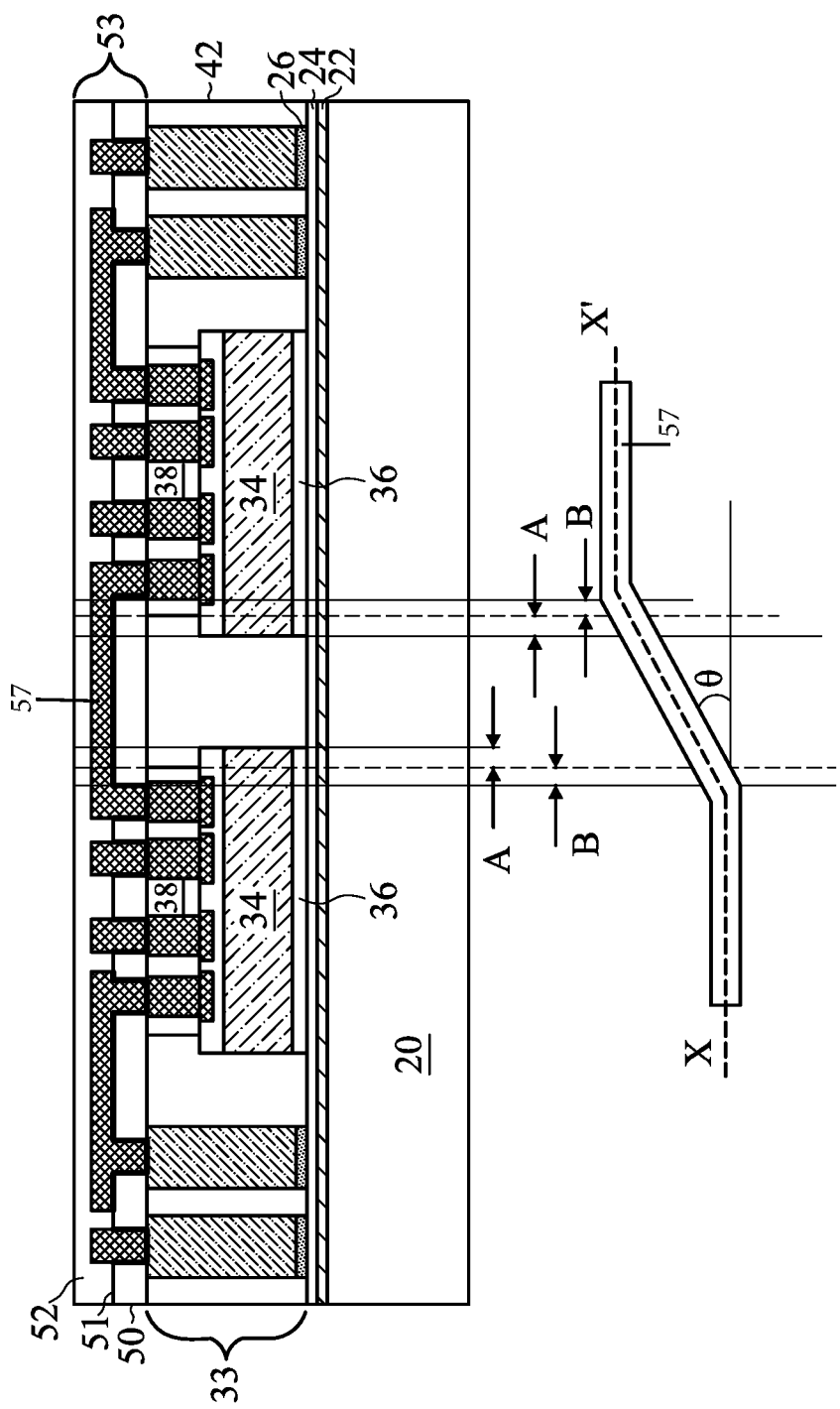
FIGS. 17-19 illustrate cross-sectional and plan views of die-to-die metal connections in accordance with exemplary embodiments.
Figure 18:
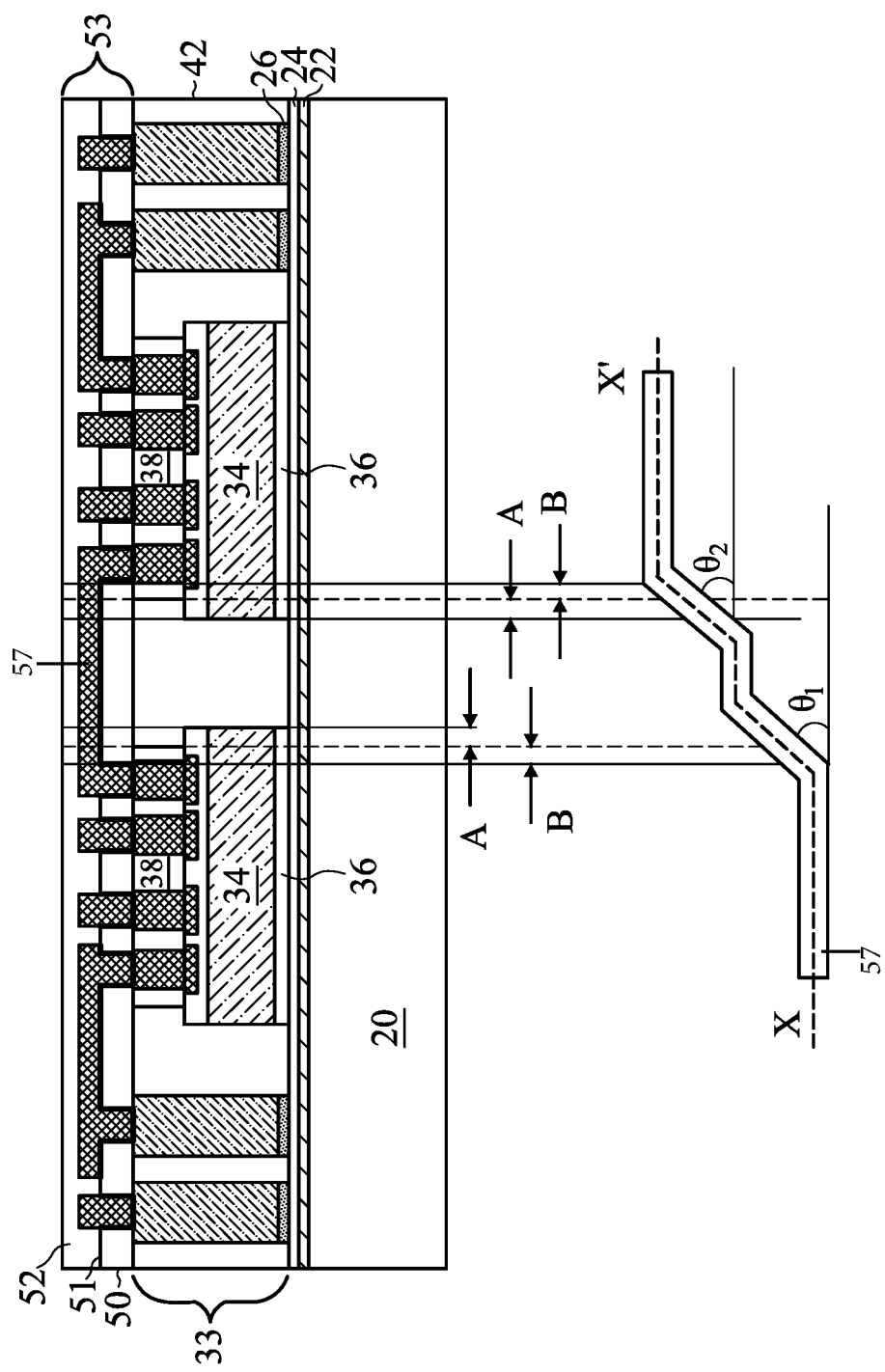
Figure 19:
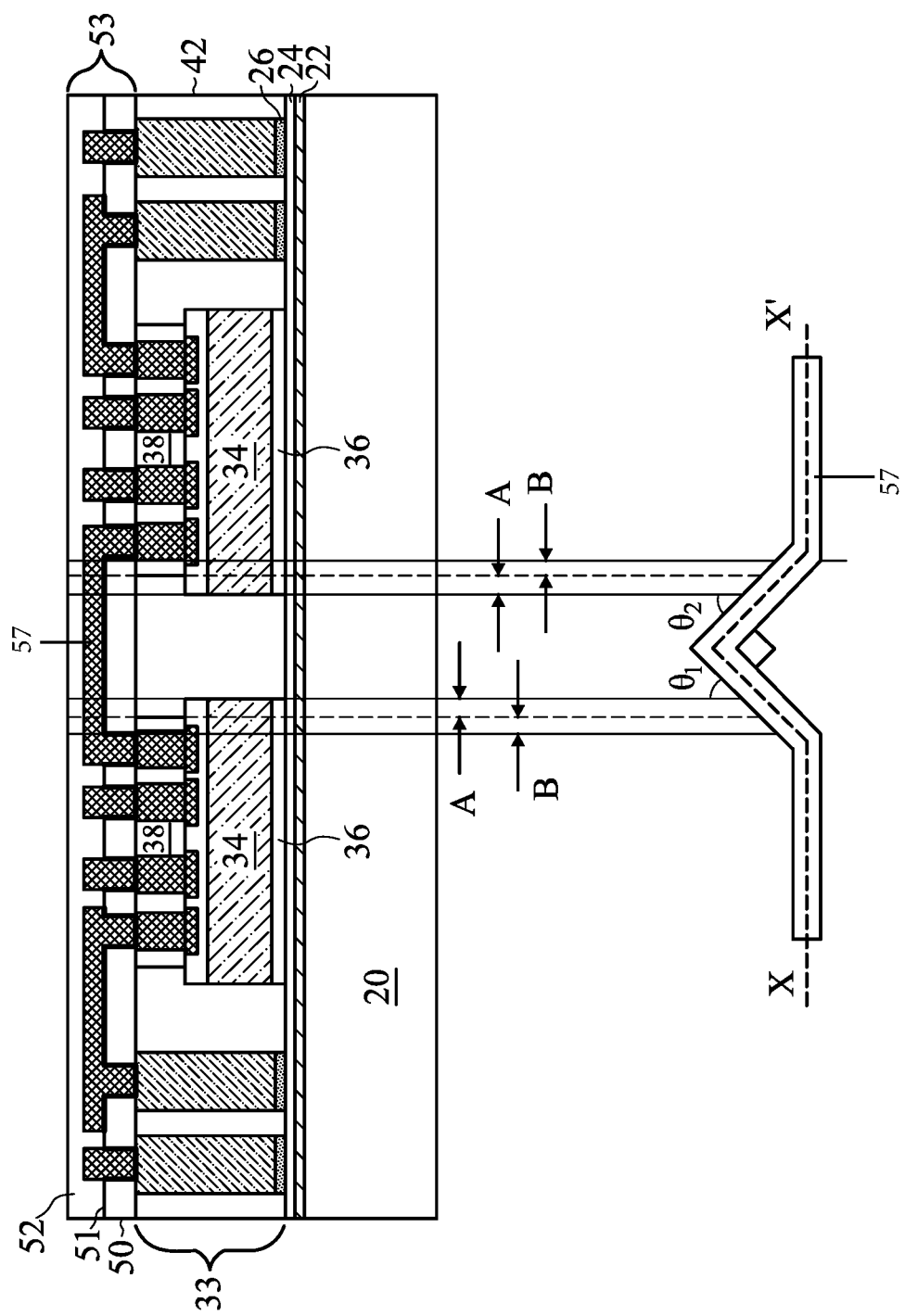

Referring to FIGS. 17-19, cross-sectional and plan views of die-to-die metal connections 57 are shown in accordance with different embodiments. The cross sectional views of FIGS. 17-19 are depicted along the metal connection 57 over the gap between the two integrated circuit dies 34, as shown by the x-x' line in the plan views of each of FIGS. 17-19. In each depicted package, the length of the metal connection 57 over the gap between two integrated circuit dies 34 is increased, which may reduce stress on the metal connection 57 and increase reliability of the connection 57 during thermal cycling.

Referring to FIG. 17, in some embodiments a die-to-die metal connection 57 forms an angular line over the gap between two integrated circuit dies 34. FIG. 17 depicts both a cross-sectional view of the package and a plan view of the die-to-die metal connection 57, with the cross-sectional view extending along the die-to-die metal connection 57 shown in the x-x' line in the plan view. Compared to a straight line extending directly between two integrated circuit dies 34 along the shortest distance between the two lines, the angular line depicted in FIG. 17 is longer, which may help to reduce stress on the metal connection 57 during thermal cycling. In some embodiments, the angular line may help to increase reliability of the connection 57.

In some embodiments, the angular line forms an angle θ with respect to a line that extends in a straight line along the shortest distance between one of the integrated circuits 34 to the other integrated circuit die 34. Angle θ is greater than 0 in some embodiments. In some embodiments, the angle θ is greater than about 15 degrees, and in some embodiments angle θ may be about 45 degrees. In some embodiments, angle θ is less than about 90 degrees. In some embodiments, the angular line is routed over the edge of each integrated circuit die 34 in a manner that it is non-perpendicular to the edge of the integrated circuit die 34. In some embodiments, compared to a normalized stress level of 1 when the die-to-die metal connection is routed along a straight line extending along the shortest distance from one integrated circuit die 34 to the other integrated circuit die 34 (when the angle θ is 0 degrees), to when the angular line is routed along an angle θ of about 22.5 degrees, the stress level may be reduced to about 0.89. In some embodiments, an angle θ of about 45 degrees may reduce the stress level to about 0.65.

In some embodiments, the metal connection 57 comprises a first turning point, which is located over a first integrated circuit die 34 where the metal connection 57 is first routed at angle θ. The first turning point is located least a distance B from the interface of dielectric layer 38 of the first integrated circuit 34 and molding material 42, where distance B is measured in a plan view. In some embodiments, distance B may be greater than 10 μm, such as about 30 μm. As described above, the interface of the dielectric layer 38 and molding material are offset from a lower edge of integrated circuit die 34 by a distance A, where distance A is measured in a plan view. In some embodiments, distance A may be about 5 μm to about 100 μm, such as about 30 μm. The metal connection 57 also comprises a second turning point over the second integrated circuit 34, where the metal connection 57 first routes away from angle θ and back to a straight line, or whatever the desired routing may be. The second turning point is located at least a distance B from the interface of the dielectric layer 38 of the second integrated circuit 34 and the molding material 42, where B is measured in a plan view. In some embodiments, distance B may be greater than 10 μm, such as about 30 μm. For the second integrated circuit, as with the first integrated circuit, the interface of the dielectric layer 38 and molding material 42 are offset from a lower edge of integrated circuit die 34 by a distance A. In some embodiments, distance A may be about 5 μm to about 100 μm, such as about 30 μm.

Other embodiments are possible. FIG. 18 depicts a package in which a die-to-die metal connection 57 is a multi-segment angular line. FIG. 18 depicts both a cross-sectional view of the package and a plan view of the die-to-die metal connection 57, with the cross-sectional view extending along the die-to-die metal connection 57 shown in x-x' line in the plan view. Compared to a straight line extending along a shortest distance between two integrated circuit dies 34, the multi-segment angular line depicted in FIG. 18 is longer, which may help to reduce stress on the metal connection 57 during thermal cycling. In some embodiments, the multi-segment angular line may help to increase reliability of the connection 57.

In some embodiments, the multi-segment angular line comprises a first angular segment, a straight segment, and a second angular segment. In some embodiments, the first angular segment partially overlies the first die and forms an angle $θ_1$ with respect to a line that extends in a straight line along the shortest distance from one of the integrated circuits 34 to the other. In some embodiments, angle $θ_1$ is greater that 0. In some embodiments, the angle $θ_1$ is greater than about 15 degrees, and in some embodiments may be about 45 degrees. In some embodiments, angle $θ_1$ is less than about 90 degrees. In some embodiments, the second angular segment partially overlies the second integrated circuit 34 and forms an angle $θ_2$ with respect to a line that extends in a straight line along the shortest distance from one of the integrated circuits 34 to another. In some embodiments, angle $θ_2$ is greater than 0. In some embodiments, the angle $θ_2$ is greater than about 15 degrees, and in some embodiments may be about 45 degrees. In some embodiments, angle $θ_2$ is less than about 90 degrees. The first angular segment and the second angular segment are connected by the straight segment. In some embodiments, when the gap between two integrated circuit dies is about 25 μm, the straight segment may be greater than 5 μm, such as about 12 μm.

In some embodiments, the metal connection 57 comprises a first turning point, which is located over a first integrated circuit die 34 where the metal connection 57 is first routed at angle θ. The first turning point is located least a distance B from the interface of dielectric layer 38 of the first integrated circuit die 34 and molding material 42, where distance B is measured in a plan view. In some embodiments, distance B may be greater than 10 μm, such as about 30 μm. As described above, the interface of the dielectric layer 38 and molding material are offset from a lower edge of the first integrated circuit die 34 by a distance A, where distance A is measured in a plan view. In some embodiments, distance A may be about 5 μm to about 100 μm, such as about 30 μm. The metal connection 57 also comprises a second turning point over the second integrated circuit 34, where the metal connection 57 first routes away from angle θ and back to a straight line, or whatever the desired routing is. The second turning point is located at least a distance B from the interface of the dielectric layer 38 of the second integrated circuit die 34 and the molding material 42, where B is measured in a plan view. In some embodiments, distance B may be greater than 10 μm, such as about 30 μm. For the second integrated circuit, as with the first integrated circuit, the interface of the dielectric layer 38 and molding material 42 are offset from a lower edge of integrated circuit die 34 by a distance A. In some embodiments, distance A may be about 5 μm to about 100 μm, such as about 30 μm.

FIG. 19 depicts a package in which a die-to-die metal connection 57 forms a two segment line over a gap between two integrated circuit dies 34. FIG. 19 depicts both a cross-sectional view of the package and a plan view of the die-to-die metal connection 57, with the cross-sectional segment extending along the die-to-die metal connection 57 depicted in x-x' line in the plan view. In some embodiments, the first segment is routed at an acute angle, $θ_1$, with respect to an edge of an integrated circuit die 34 that faces a second integrated circuit die 34. In some embodiments, angle $θ_1$ is less than about 90 degrees. The second segment may be connected to the first segment and routed at an acute angle $θ_2$, with respect to an edge of the second integrated circuit die that faces the first integrated circuit. In FIG. 19, the two segments form a right angle to each other, but other embodiments are possible. In some embodiments, an angle that is greater than 90 degrees may be used. Compared to a straight line extending along a shortest distance between two integrated circuit dies 34, the two segment line depicted in FIG. 19 is longer, which may help to reduce stress on the metal connection during thermal cycling. In some embodiments, the two segment line may help to increase reliability of the connection 57.

In some embodiments, the metal connection 57 comprises a first turning point, which is located over a first integrated circuit die 34 where the metal connection is first routed at angle θ. The first turning point is located least a distance B from the interface of dielectric layer 38 of the first integrated circuit die 34 and molding material 42, where distance B is measured in a plan view. In some embodiments, distance B may be greater than 10 μm, such as about 30 μm. As described above, the interface of the dielectric layer 38 of the first integrated circuit die 34 and molding material are offset from a lower edge of the first integrated circuit die 34 by a distance A, where distance A is measured in a plan view. In some embodiments, distance A may be about 5 μm to about 100 μm, such as about 30 μm. The metal connection 57 also comprises a second turning point over the second integrated circuit 34, where the metal connection 57 first routes away from angle θ and back to a straight line, or whatever the desired routing may be. The second turning point is located at least a distance B from the interface of the dielectric layer 38 of the second integrated circuit 34 and the molding material 42, where B is measured in a plan view. In some embodiments, distance B may be greater than 10 μm, such as about 30 μm. For the second integrated circuit 34, as with the first integrated circuit 34, the interface of the dielectric layer 38 and molding material 42 are offset from a lower edge of integrated circuit die 34 by a distance A. In some embodiments, distance A may be about 5 μm to about 100 μm, such as about 30 μm.

Although one layer of RDLs 53 is depicted in FIGS. 17-20, in some embodiments, additional RDLs 53 may be formed. The additional RDLs may be formed using similar processes and materials as described above with reference to other RDLs.

Figure 20:
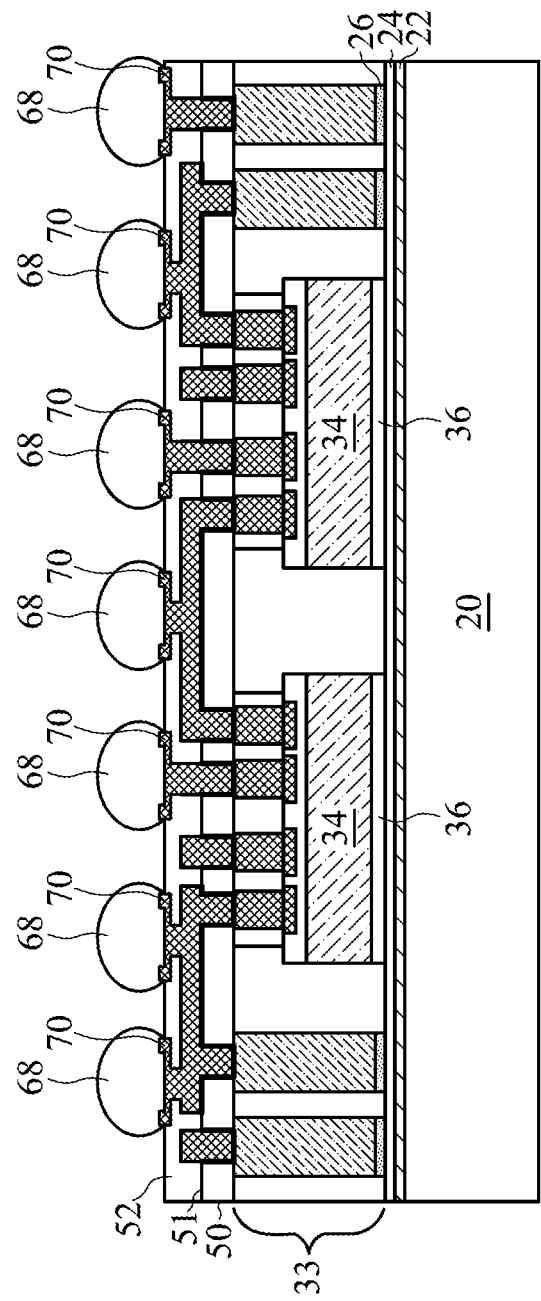
FIGS. 20 through 22 are cross-sectional views of intermediate stages in the manufacturing of a TV package in accordance with some exemplary embodiments.

FIG. 20 illustrates an under bump metallization (UBM) 70 formed and patterned over an uppermost metallization pattern in accordance with some embodiments, thereby forming an electrical connection with an uppermost metallization layer. The UBM 70 provides an electrical connection upon which an electrical connector, e.g., a solder ball/bump, a conductive pillar, or the like, may be placed. In an embodiment, the under bump metallization 70 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 70 is formed using sputtering. In other embodiments, electro plating may be used.

Connectors 68 are formed over the under bump metallization 70 in accordance with some embodiments. The connectors 68 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 68 may include a conductive material such as solder, copper, aluminum, gold, nickel, silver, palladium, tin, the like, or a combination thereof. In some embodiments, the connectors 68 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 68 may form a grid, such as a ball grid array (BGA). In some embodiments, a reflow process may be performed, giving the connectors 68 a shape of a partial sphere in some embodiments. Alternatively, the connectors 68 may comprise other shapes. The connectors 68 may also comprise non-spherical conductive connectors, for example.

In some embodiments, the connectors 68 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 21:
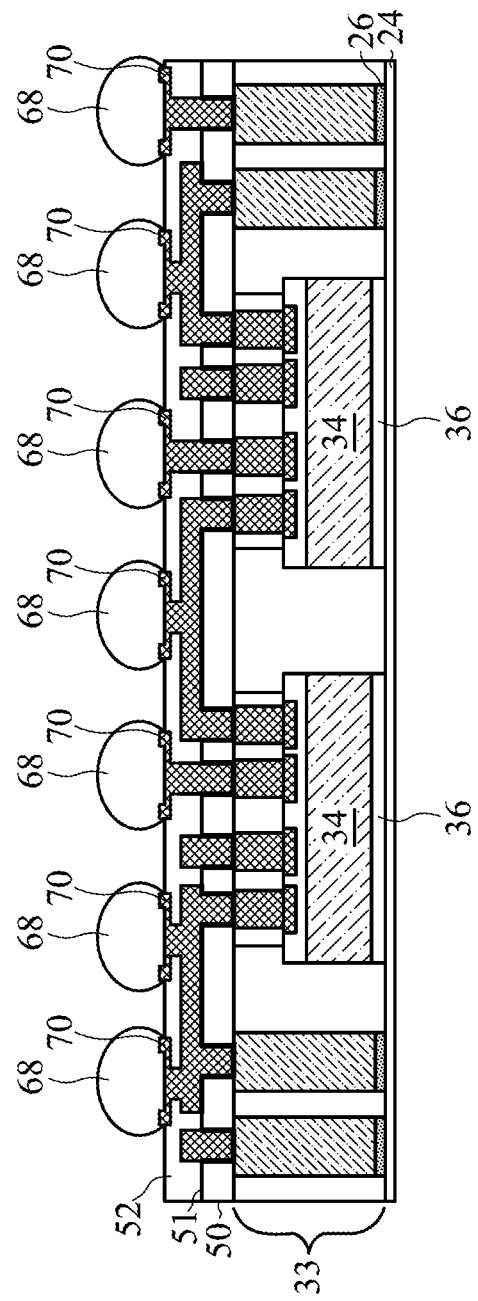

Next, carrier substrate 20 is de-bonded from the package. Release layer 22 is also cleaned from the package. The resulting structure is shown in FIG. 21. If more than one package has been formed on a wafer, the wafer is singulated to form individual packages.

Figure 22:
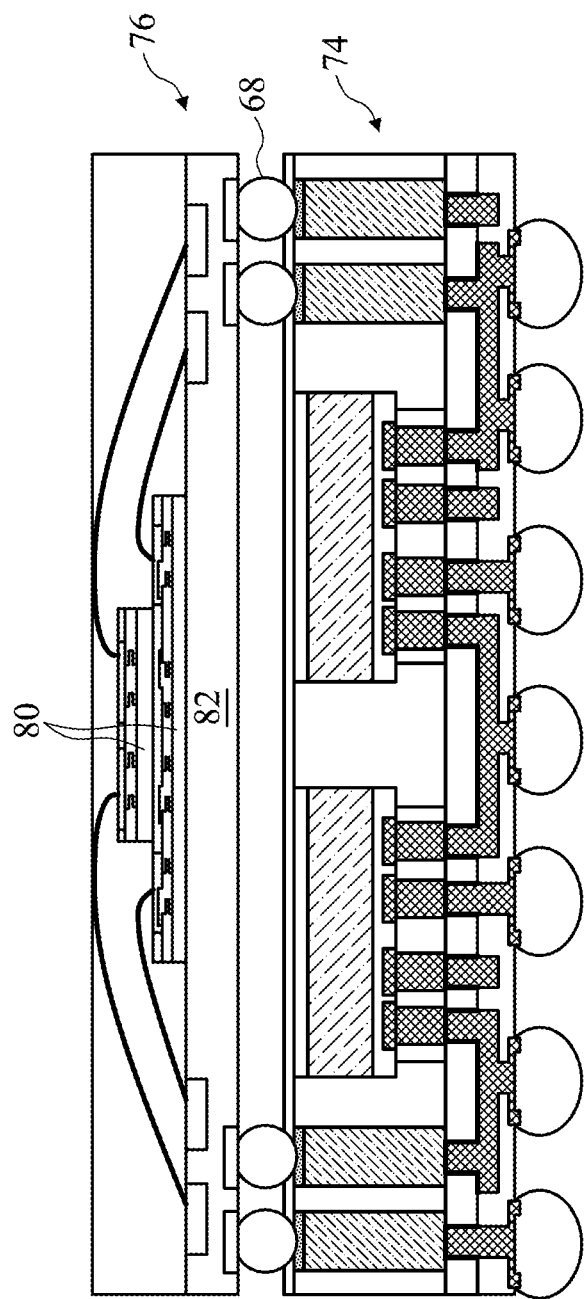

FIG. 22 illustrates the bonding of top package 76 to TV package 74, wherein the bonding may be through solder regions 68. In some embodiments, top package 76 includes dies 80 bonded to package substrate 82. Dies 80 may include a memory die(s), which may be, for example, a Static Random Access Memory (SRAM) die, a Dynamic Random Access Memory (DRAM) die, or the like.

In some embodiments, a method of forming a semiconductor device is provided. The method includes forming a molding compound extending along sidewalls of a first die and a second die. A redistribution layer is formed over the first die, the second die, and the molding compound, the redistribution layer including a conductor overlying a gap between the first die and the second die. The conductor is routed at a first angle over an edge of the first die. The first angle is measured with respect to a shortest line between the first die and the second die, and the first angle is greater than 0.

In some embodiments, a method of forming a semiconductor device is provided. The method includes placing a first die on a substrate, a top surface of the first die including a first dielectric layer. An edge of the first dielectric layer is offset from a lower edge of the first die. A second die is placed on the substrate, a top surface of the second die including a second dielectric layer. An edge of the second dielectric layer is offset from a lower edge of the second die. Molding compound is formed, extending along sidewalls of the first die and the second die. A through via extending through the molding compound is formed. A redistribution layer is formed over the first die and the second die, the redistribution layer including a conductor overlying a gap between the first die and the second die. The conductor is routed over the edge of the first die in a manner that is non-perpendicular to an edge of the first die that faces the second die.

In some embodiments, a semiconductor device is provided. The semiconductor device includes a first die and a second die. Molding material extends between the first die and the second die. A redistribution layer overlies the first die and the second die, the redistribution layer including a conductor overlying a gap between the first die and the second die. The conductor is routed at a first angle over an edge of the first die. The first angle is measured with respect to a shortest line between the first die and the second die, and the first angle is greater than 0.

A semiconductor device is provided in accordance with some embodiments. The semiconductor device includes a first die, a second die, and a molding material extending between the first die and the second die. The semiconductor device includes a redistribution layer overlying the first die and the second die, the redistribution layer including a conductor continuously extending, in a plan view, from a sidewall of the first die that is closest to the second die to a sidewall of the second die that is closest to the first die, the conductor being routed at a first angle over an edge of the first die, the first angle being measured in a plan view and with respect to a shortest line between the first die and the second die, and the first angle being greater than 0. In an embodiment the first die comprises a first dielectric layer on a first substrate, an edge of the first dielectric layer being offset from an edge of the first substrate, and the second die comprises a second dielectric layer on a top surface of a second substrate, an edge of the second dielectric layer being offset from an edge of the second substrate, where the conductor comprises a first turning point over the first dielectric layer, the first turning point being located where the conductor is first routed at the first angle. In an embodiment the conductor is routed at the first angle over the edge of the second dielectric layer, and the first angle is greater than about 15 degrees. In an embodiment, the conductor comprises a second turning point over the second dielectric layer, and the second turning point located where the conductor is first routed away from the first angle. In an embodiment, the conductor comprises: a first segment partially overlying over the first die and routed at the first angle, a second segment connected to the first segment routed at a second angle, and a third segment connected to the second segment, partially overlying the second die, and routed at a third angle, the third angle being greater than 0, where the second angle and the third angle are measured in a plan view and with respect to a shortest line between the first die and the second die. In an embodiment, the conductor comprises a first segment partially overlying the first die and routed at the first angle, and a second segment connected to the first segment, partially overlying the second die, and routed at a second angle, where the first segment is routed at an acute angle with respect to an edge of the first die that faces the second die, and the second angle is an acute angle with respect to an edge of the second die that faces the first die. In an embodiment the first segment forms a perpendicular angle to the second segment, the perpendicular angle being located over the molding material that extends between the first die and the second die. In an embodiment the first angle is about 45 degrees.

A semiconductor device is provided in accordance with some embodiments. The semiconductor device includes a first die and a second die positioned next to the first die. The semiconductor device also includes a first dielectric layer overlying the first die and the second die. The semiconductor device also includes a conductor extending in the first dielectric layer, where the conductor is continuous, in a plan view, between a sidewall of the first die and a sidewall of the second die, and where the conductor is routed at a first angle over an edge of the first die, the first angle being measured in the plan view with respect to the sidewall of the first die, and the first angle being non-perpendicular. In an embodiment the conductor extends in a straight line between the first die and the second die. In an embodiment the conductor is first routed to the first angle at a first turning point, the first turning point being located over the first die and offset from the sidewall of the first die. In an embodiment the conductor is routed at a second angle over an edge of the second die, the second angle being measured in a plan view with respect to the sidewall of the second die, and the second angle being non-perpendicular. In an embodiment the conductor is first routed away from the second angle at a second turning point, the second turning point being located over the second die and offset from the sidewall of the second die. In an embodiment the conductor is first routed away from the first angle at a third turning point, the third turning point being located over a line that extends along a shortest distance between the sidewall of the first die and the sidewall of the second die.

A semiconductor device is provided in accordance with some embodiments. The semiconductor device includes a first die, the first die comprising a first substrate and a first dielectric layer overlying the first substrate, an edge of the first substrate being offset from an edge of the first dielectric layer. The semiconductor device also includes a second die positioned next to the first die, the second die comprising a second substrate and a second dielectric layer overlying the second substrate, an edge of the second substrate being offset from an edge of the second dielectric layer; The semiconductor device also includes a redistribution layer overlying the first die and the second die, the redistribution layer comprising a conductor that continuously extends, in a plan view, between a sidewall of the first die and a sidewall of the second die, where the conductor is routed across the sidewall of the first die at a first angle, where the first angle is measured in the plan view and with respect to a shortest line between the first die and the second die, and the first angle being greater than 0. In an embodiment the conductor is first routed to the first angle at a first turning point, the first turning point being located over the first dielectric layer. In an embodiment the semiconductor device also includes molding material extending between the first die and the second die, wherein the first turning point is laterally offset from an interface between the molding material and the first dielectric layer. In an embodiment the conductor is routed across the sidewall of the second die at a second angle, wherein the first angle and the second angle are the same. In an embodiment the conductor is first routed to the second angle at a second turning point, the second turning point being located over the second dielectric layer. In an embodiment the semiconductor device also includes a molding material extending between the first die and the second die, wherein the second turning point is laterally offset from an interface of the molding material and the second dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

The invention claimed is:

1. A device, comprising:
   a first die;
   a second die;
   a molding material extending between the first die and the second die; and
   a redistribution layer overlying the first die and the second die, the redistribution layer including a conductor continuously extending, in a plan view, from a sidewall of the first die that is closest to the second die to a sidewall of the second die that is closest to the first die, the conductor being routed at a first angle over the sidewall of the first die, the first angle being measured in a plan view and with respect to a shortest line between the first die and the second die, and the first angle being greater than 0.

2. The device according to claim 1, wherein:
   the first die comprises a first dielectric layer on a first substrate, an edge of the first dielectric layer being offset from an edge of the first substrate; and
   the second die comprises a second dielectric layer on a second substrate, an edge of the second dielectric layer being offset from an edge of the second substrate;
   wherein the conductor comprises a first turning point over the first dielectric layer, the first turning point being located where the conductor is first routed at the first angle.

3. The device according to claim 2, wherein the conductor is routed at the first angle over the edge of the second dielectric layer, and the first angle is greater than about 15 degrees.

4. The device according to claim 3, wherein the conductor comprises a second turning point over the second dielectric layer, the second turning point located where the conductor is first routed away from the first angle.

5. The device according to claim 1, wherein the conductor comprises:
   a first segment partially overlying over the first die and routed at the first angle;
   a second segment connected to the first segment routed at a second angle; and
   a third segment connected to the second segment, partially overlying the second die, and routed at a third angle, the third angle being greater than 0;
   wherein the second angle and the third angle are measured in a plan view and with respect to a shortest line between the first die and the second die.

6. The device according to claim 1, wherein the conductor comprises:
   a first segment partially overlying the first die and routed at the first angle; and
   a second segment connected to the first segment, partially overlying the second die, and routed at a second angle;
   wherein the first segment is routed at an acute angle with respect to an edge of the first die that faces the second die, and the second angle is an acute angle with respect to an edge of the second die that faces the first die.

7. The device according to claim 6, wherein the first segment forms a perpendicular angle to the second segment, the perpendicular angle being located over the molding material that extends between the first die and the second die.

8. The device according to claim 1, wherein the first angle is about 45 degrees.

9. A device, comprising:
   a first die;
   a second die positioned next to the first die;
   a first dielectric layer overlying the first die and the second die;
   a conductor extending in the first dielectric layer, wherein the conductor is continuous, in a plan view, between a sidewall of the first die and a sidewall of the second die, and wherein the conductor is routed at a first angle over an edge of the first die, the first angle being measured in the plan view with respect to the sidewall of the first die, and the first angle being non-perpendicular.

10. The device according to claim 9, wherein the conductor extends in a straight line between the first die and the second die.

11. The device according to claim 9, wherein the conductor is first routed to the first angle at a first turning point, the first turning point being located over the first die and offset from the sidewall of the first die.

12. The device according to claim 9, wherein the conductor is routed at a second angle over an edge of the second die, the second angle being measured in a plan view with respect to the sidewall of the second die, and the second angle being non-perpendicular.

13. The device according to claim 12, wherein the conductor is first routed away from the second angle at a second turning point, the second turning point being located over the second die and offset from the sidewall of the second die.

14. The device according to claim 13, wherein the conductor is first routed away from the first angle at a third turning point, the third turning point being located over a line that extends along a shortest distance between the sidewall of the first die and the sidewall of the second die.

15. A semiconductor device, comprising:
   a first die;
   a second die next to the first die;
   a molding material extending along a sidewall of the first die and a sidewall of the second die, wherein a first portion of the molding material extends between the first die and the second die; and
   a redistribution structure overlying the first die and the second die, the redistribution structure comprising a conductor that overlies the first portion of the molding material, wherein the conductor is laterally routed over the sidewall of the first die at a first angle, the first angle being measured in a plan view with respect to the sidewall of the first die, and the first angle being an acute angle.

16. The semiconductor device according to claim 15, wherein the sidewall of the first die faces the second die.

17. The semiconductor device according to claim 15, wherein the conductor is continuous in a plan view between the sidewall of the first die and a sidewall of the second die.

18. The semiconductor device according to claim 15, further comprising a through via extending through the molding material.

19. The semiconductor device according to claim 15, wherein the conductor is laterally routed over a sidewall of the second die at a second angle, the second angle is measured with respect to a shortest line between the first die and the second die, and the second angle is an acute angle.

20. The semiconductor device according to claim 15, wherein the first die comprises a first substrate and a first dielectric layer, a sidewall of the first dielectric layer is offset from a sidewall of the first substrate, and the conductor is laterally routed over a sidewall of the first dielectric layer in a manner that is non-perpendicular to the sidewall of the first dielectric layer.

* * * * *